United States Patent
Laufer et al.

(10) Patent No.: US 10,027,470 B1
(45) Date of Patent: Jul. 17, 2018

(54) SIGNAL DETECTION TECHNIQUES USING CLOCK DATA RECOVERY

(71) Applicant: INTEL CORPORATION, Santa Clara, CA (US)

(72) Inventors: Amir Laufer, Petach Tiqwa (IL); Itamar Levin, Holon (IL); Kevan A. Lillie, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/393,186

(22) Filed: Dec. 28, 2016

(51) Int. Cl.
*H04L 7/04* (2006.01)
*H04L 7/00* (2006.01)
*H03L 7/08* (2006.01)

(52) U.S. Cl.
CPC ............ *H04L 7/048* (2013.01); *H03L 7/0807* (2013.01); *H04L 7/0079* (2013.01)

(58) Field of Classification Search
CPC ......... H04L 7/033; H04L 7/04; H04L 7/0016; H03L 7/0807
USPC ..... 375/362, 224, 326, 283, 340; 331/17, 25
See application file for complete search history.

(56) References Cited

U.S. PATENT DOCUMENTS

| | | | | |
|---|---|---|---|---|
| 2004/0232951 A1* | 11/2004 | Tan | ......................... | H03L 7/095 327/105 |
| 2014/0233619 A1* | 8/2014 | Sindalovsky | ........... | H04L 27/01 375/224 |
| 2015/0263848 A1* | 9/2015 | Mobin | .................. | H03L 7/0807 375/357 |
| 2016/0365071 A1* | 12/2016 | Lim | ......................... | G09G 5/18 |

* cited by examiner

*Primary Examiner* — Khai Tran

(57) ABSTRACT

Techniques and apparatus for detection of a signal at an I/O interface module are described. In one embodiment, for example, an apparatus to provide signal detection may include at least one receiver, at least one memory, and logic for a signal detection module, at least a portion of the logic comprised in hardware coupled to the at least one memory and the at least one receiver, the logic to access a plurality of pulse signals of a clock and data recovery (CDR) circuit, analyze at least one pulse characteristic of the plurality of pulse signals, and generate a signal determination to indicate a signal at the at least one receiver based on the at least one pulse characteristic. Other embodiments are described and claimed.

23 Claims, 6 Drawing Sheets

SIGNAL DETECTION TECHNIQUES USING CLOCK DATA RECOVERY

TECHNICAL FIELD

Embodiments herein generally relate to information processing, and more particularly, to input signal detection techniques.

BACKGROUND

The bandwidth requirements of computing device input/output (I/O) interfaces have been increasing to meet data consumer demand. For example, high-speed serial I/O interfaces are approaching 10 Gbit. Providing reliable data communications at these speeds is often complex and challenging as inter-symbol interference (ISI), random and deterministic jitter, crosstalk and supply noise can severely degrade the signal, which results in challenges to recover the signal on the receiver side. I/O interface link establishment and other operational functions, such as equalization adaption, require a valid input signal.

Conventional signal detection methods are subject to false signal detection (for instance, detecting a signal when no signal is present) and other adverse results. For example, a typical delay-based method involves causing the system to wait to improve a likelihood that a valid signal is present. However, such delay-based methods results in longer than necessary link establishment times for link partners. In another example, an analog circuit may be used to detect an incoming signal amplitude. Such analog circuits are problematic due to, among other things, silicon variation affecting the accuracy of the thresholds. In addition, at high data rates, an input signal may have a very low amplitude, in which case cross-talk or other interference may be perceived as a valid signal or a signal with sufficient amplitude may be present may not have a correct data rate. Accordingly, signal detection techniques are needed that are capable of providing efficient and accurate signal detection for communication systems.

DETAILED DESCRIPTION

Figure 1:
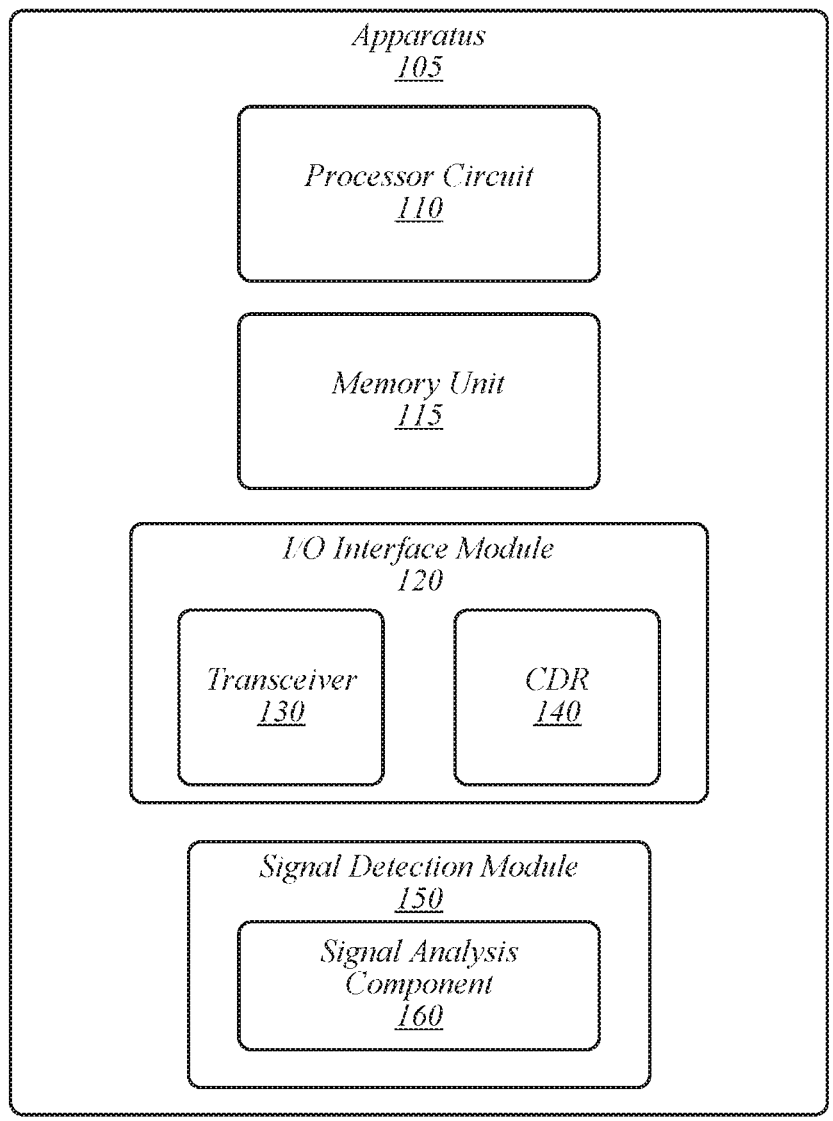
FIG. 1 illustrates an embodiment of a first operating environment.

Various embodiments may be generally directed to techniques for signal detection within a computer system. The computer system may include a signal detection module operative to analyze signal information of a clock recovery element of an input/output (I/O) interface of the computer system. In some embodiments, the signal information may include pulses or other signals associated with adjustment of an input signal to a clock recovery element. In some embodiments, the clock recovery element may include a clock and data recovery (CDR) circuit. Various components of the clock recovery element may operate to adjust certain signals based on an input signal to the clock recovery element. For instance, the gain of a variable gain amplifier (VGA) may be adjusted (for example, increased or decreased) to allow a clock recovery function to match a frequency of an incoming input signal. Adjustment of the signal using "up" or "down" (or neither) phase error signals may generate detectable pulses. Characteristics of the pulses ("pulse characteristics") may be analyzed by the signal detection module to determine whether a valid signal is being received a corresponding I/O interface. Non-limiting examples of pulse characteristics may include a number of up or down pulses (for instance, a "pulse count"), a directionality of the up and/or down pulses (for instance, a "pulse directionality"), and/or the like.

For example, in an embodiment, an apparatus to provide signal detection may include at least one receiver, at least one memory, and logic for a signal detection module, at least a portion of the logic comprised in hardware coupled to the at least one memory and the at least one receiver, the logic to access a plurality of pulse signals of a clock and data recovery (CDR) circuit, analyze at least one pulse characteristic of the plurality of pulse signals, and generate a signal determination to indicate a signal at the at least one receiver based on the at least one pulse characteristic.

In general, some embodiments may provide a signal detection process and/or a signal detection circuit operative to detect whether an I/O interface or a component of an I/O interface is or has received a valid signal. A clock recovery circuit used according to some embodiments may operate to reject invalid inputs and to filter noise signal. In addition, an automatic gain level of a receiver's front-end amplifier may qualify a clock recovery state. Accordingly, in some embodiments, the signal detection process may use possible states of a clock recovery function of the clock recovery circuit to identify when the clock recovery function is unable to lock-on to a valid input signal. In some embodiments, a signal detection process may use a time-out condition at which point certain signal functions, such as equalization may be initiated, for instance, in case additional equalization may be necessary to assist the clock recovery circuit to align an input signal. In some embodiments, a clock recovery circuit may include a clock and data recovery (CDR) circuit, a phase locked loop (PLL) circuit, and/or the like. Embodiments are not limited in this context.

Conventional methods depend on sufficient amplitude exclusively to detect a signal, or by assuming that a signal is valid after a time period has elapsed. However, with amplitude-based detection, there may be false positives when signals are present with sufficient amplitude, but with incorrect frequency. In addition, false negatives may occur with signals with correct edge rates, but insufficient amplitude to trigger an amplitude detection circuit. Furthermore, using time-based methods, particularly using time exclusively, to ensure a valid input signal is also insufficient. For example, time-based methods are problematic in cases where a valid signal is never applied or a valid signal may be present for some time before equalization convergence starts resulting in a prolonged link establishment process or reduced time is available to perform convergence because time was spend waiting to ensure a signal was present. Accordingly, various embodiments provide signal detection process may use the ability of a clock recovery function to identify the correct signal rate to identify the presence of a valid signal. For example, by requiring a signal of the correct rate, the signal detection process and/or signal detection circuit may reduce, eliminate, or substantially eliminate false detection of invalid signals because, for instance, the signals have different periods, or no signal at all (for instance, no edges), and in conjunction with an input amplifier gain value signals with an amplitude too low but with some edges.

Various embodiments may comprise one or more elements. An element may comprise any structure arranged to perform certain operations. Each element may be implemented as hardware, software, firmware, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

FIG. 1 illustrates an example of an operating environment 100 that may be representative of various embodiments. The operating environment 100 depicted in FIG. 1 may include an apparatus 105 having a processor circuit 110 and a memory unit 115. Processor circuit 110 may include and or may access logic having instructions for performing operations according to some embodiments. Processor circuit 110 may be communicatively coupled to memory unit 115.

As shown in FIG. 1, apparatus 105 may include an I/O interface module 120. In some embodiments, I/O interface module 120 may include a serial I/O interface module, card, board, circuit, or other element or device. In some embodiments, I/O interface module 120 may include an Ethernet interface module, for example, a network interface card (NIC) capable of communicating using Institute of Electrical and Electronics Engineers (IEEE) 802.3, 802.11, and/or other related communication standards. In various embodiments, I/O interface module 120 may include a high-speed I/O device, such as a 10 Gbit Ethernet interface card. In some embodiments, I/O interface module 120 may be implemented in software, firmware, hardware, or any combination thereof.

I/O interface module 120 may include a transceiver 130 (or a separate transmitter and receiver) for transmitting and receiving data with one or more link partners communicatively coupled to apparatus 105 through I/O interface module 120. In various embodiments, I/O interface module 120 may include a clock and data recovery (CDR) 140 circuit. In some embodiments, CDR 140 may be communicatively coupled with transceiver 130. In some embodiments, CDR 140 may be arranged within transceiver 130, for example, within a receiver portion thereof. In general, CDR 140 may be a receiver (RX) component of I/O interface module 120. In order to transmit serial data at a high speed, CDR 140 may extract phase information from received serial data and generate a clock in synchronization with the data (for instance, outputs recovered clock and data signals for the RX component). In some embodiments, CDR 140 may include a phase detector operative to detect phase (and frequency) differences (for instance, phase error and/or early-or-late information) between input data to the CDR and output data, for example, of a voltage-controlled oscillator (VCO) (see, for example, FIG. 2). The phase detector may generate phase error signals, including "up" and/or "down" signals, for VCO to control an output clock signal up or down.

Figure 2:
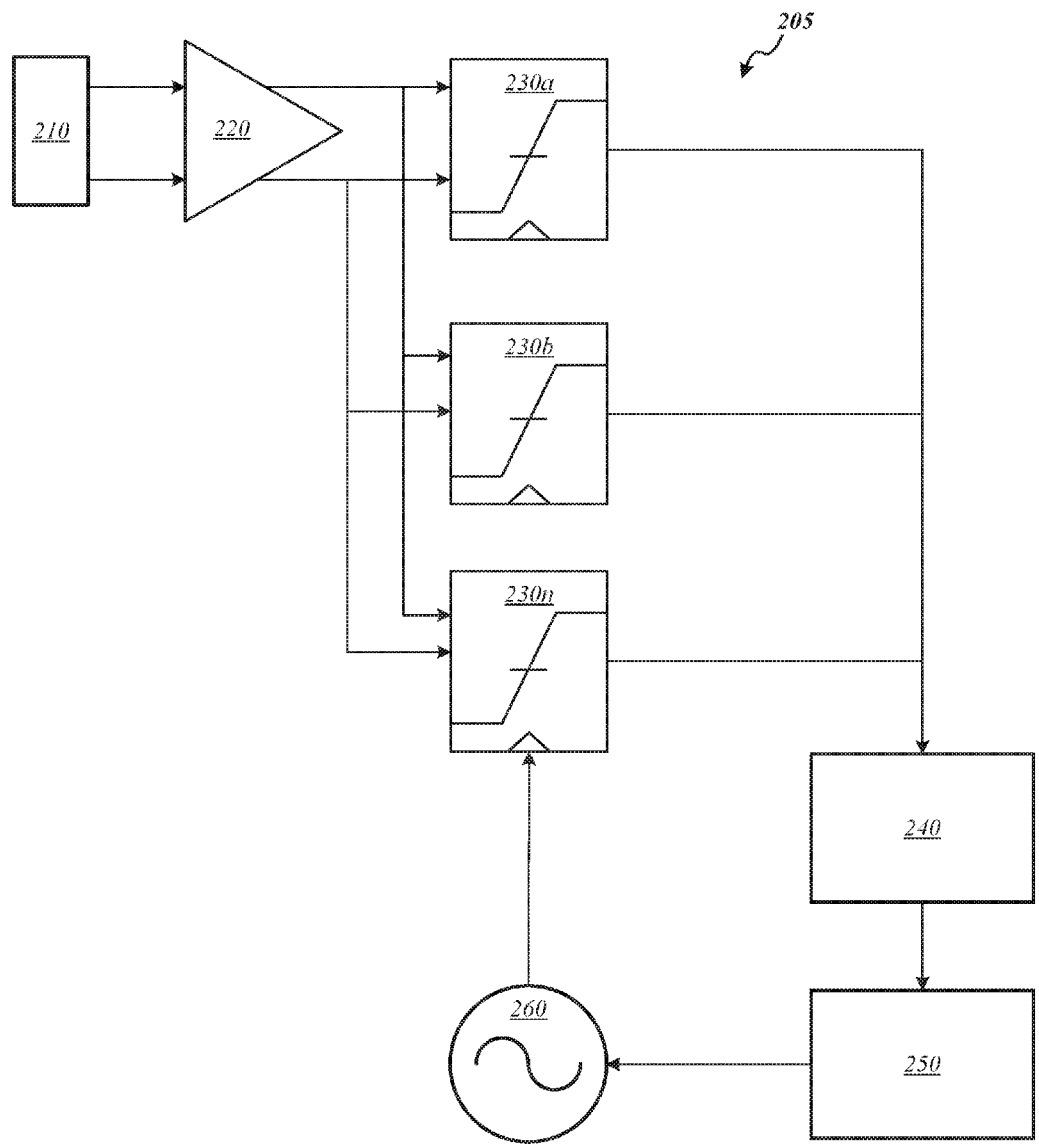
FIG. 2 illustrates an embodiment of a second operating environment.

As shown in FIG. 2, apparatus 105 may include a signal detection module 150. In some embodiments, signal detection module 150 may be implemented in software, firmware, hardware, or any combination thereof. In some embodiments, signal detection module 150 may be arranged within I/O interface module 120. For example, signal detection module 150 may include firmware, an I/O interface driver, hardware state machine, and/or the like installed, arranged, or otherwise incorporated within I/O interface module 120. In some embodiments, signal detection module 150 may operate to determine whether a valid signal is being received by I/O interface module 120 and to generate a valid input indicator responsive to and/or while determining I/O interface module 120 is receiving a valid signal. In some embodiments, signal detection module 150 may operate to generate an invalid input indicator or to not generate the valid input indicator responsive to determining that I/O interface module 120 is not receiving a valid signal. In some embodiments valid input indicator may include a binary signal using, for example, "1" for a valid signal and "0" for no signal and/or an invalid signal.

Signal detection module 150 may include a signal analysis component 160 configured to analyze signals and/or other information generated by CDR to determine whether I/O interface module 120 is receiving a valid signal. In various embodiments, signal analysis component may receive and analyze signal information associated with the phase error "up" and/or "down" signals generated by the phase detector of CDR 140 to determine whether I/O interface module 120 is receiving a valid signal. Signal analysis component 160 may receive, determine, generate, or otherwise access signal information based on the phase error information of the phase detector of CDR 140. For example, signal analysis component 160 may use the detection of edges by the phase detector and/or the relative numbers of phase error signals to determine whether a valid signal is present at the receiver of I/O interface module 120.

FIG. 2 illustrates an example of an operating environment 200 that may be representative of various embodiments. The operating environment 200 depicted in FIG. 2 may include a CDR 205 configured to receive input signals 210 that may travel to a variable gain amplifier 220 at the input of a receiver (for example, a receiver of transceiver 130). In some embodiments, the gain of variable gain amplifier 220 may be adjusted to produce an optimal signal swing for the input to one or more comparators 230$a$-$n$. The gain level of variable gain amplifier 220 may indicate signal amplitude of the input signals 210 at the input of the receiver. In some embodiments, this amplitude information may be used to qualify a determination of a signal presence by CDR 205.

In general, CDR 205 operates to adjust an output frequency of a local voltage controlled oscillator (VCO) 260 to match the frequency of input signals 210 received from a link partner. CDR 205 may perform a clock recovery process in which detected signal edges are analyzed at comparators (230$a$-$n$) (for example, data and error slicers/comparators) to determine CDR should advance (increase) or retard (decrease) the frequency of VCO 260. If the frequency of VCO 260 is slower than a frequency of input signal 210, phase detector 240 may produce "up" pulses which may be filtered by filter and accumulator 250 by accumulating enough "up" pulses to request that VCO 260 increase the VCO frequency. If the frequency of VCO 260 is faster than a frequency of input signal 210, phase detector 240 may produce "down" pulses which may be filtered by filter and accumulator 250 by accumulating enough "down" pulses to request that VCO 260 decrease the VCO frequency. In some embodiments (see, for example, FIG. 3), detection of the edges by phase detector 240 and a relative number of "up" and "down" pulses may be used to determine if a valid signal is present at the input of the receiver.

Figure 3:
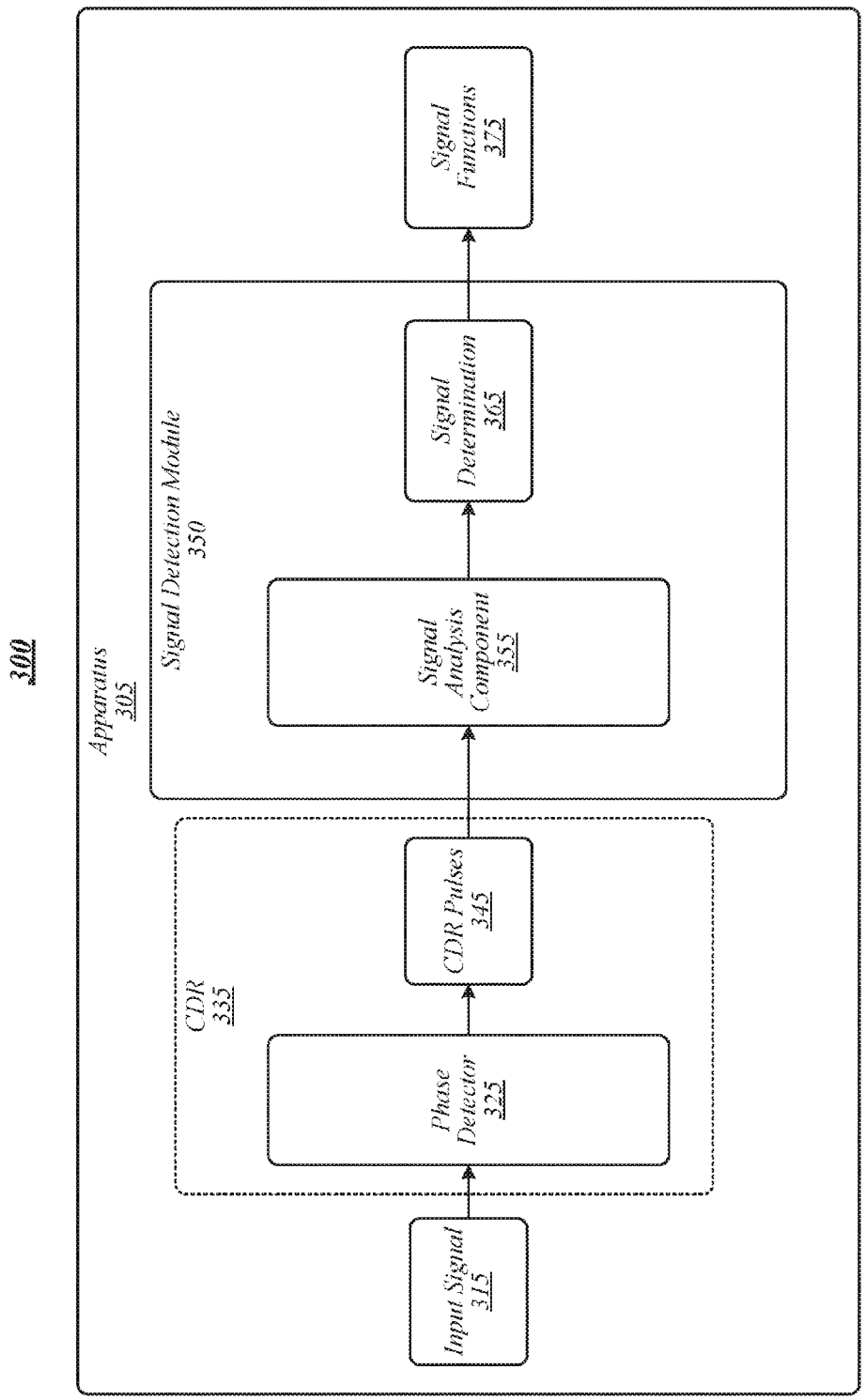
FIG. 3 illustrates an embodiment of a third operating environment.

FIG. 3 illustrates an example of an operating environment 300 that may be representative of various embodiments. The operating environment 300 depicted in FIG. 3 may include an apparatus having a signal detection module 350 and a CDR 335. As shown in FIG. 3, CDR 335 may receive input signal 315, for example, communication signals transmitted by a link partner. Input signal 315 may be received or otherwise accessed by a phase detector 325 of CDR 335. Phase detector 325 may generate CDR pulses 345 in order to control an output signal of a VCO of CDR to match or otherwise correspond with input signal 315.

A signal analysis component 355 of signal detection module 350 may receive or otherwise access CDR pulses 345. Signal analysis component may analyze CDR pulses 345 and/or characteristics thereof to determine whether there is a valid signal being received by a receiver associated with CDR. In some embodiments, a pulse characteristic may include a number of up and down pulses by phase detector 325 (for instance, a "pulse count"), which may be used to determine a validity of an input signal. For example, if there are no edges detected by phase detector 325, neither up nor down pulses may be generated nor accumulated. In another example, if there is a relatively small number edges detected by phase detector 325, no or a relatively small number of up and/or down pulses may be generated by phase detector 325. No edges or a relatively small number of edges being detected by phase detector and a resulting low pulse may indicate that there is not a valid signal or a very small signal at the receiver input such that there is not a sufficient valid signal for the comparators to sample and the clock recovery function of CDR 335 is unable to track the frequency of input signals.

Accordingly, signal analysis component 355 may generate a signal determination 365 based on the pulse count. For example, if the signal analysis component 355 determines that there is not a valid signal or a very small signal such that the clock recovery function of CDR 335 is unable to track the frequency of input signals, the signal determination 365 may include an "unable to track" determination 365 based on the number of pulses pulse characteristic (for instance, being below a count threshold value). Alternatively, if the signal analysis component 355 determines that there is a valid signal or a sufficiently large signal such that the clock recovery function of CDR 335 is able to track the frequency of input signals, the signal determination 365 may include an "able to track" determination 365 based on the pulse count. For example, if the pulse count is within the count threshold, for instance, for the duration of a pulse analysis duration, the signal analysis component 355 may generate an "able to track" determination and/or a valid signal determination. In another example, if the pulse count is outside of the count threshold, for instance, for the duration of a pulse analysis duration, the signal analysis component 355 may generate an "unable to track" determination and/or an invalid signal determination. In some embodiments, the count threshold may include a minimum value of the pulse count.

In some embodiments, if the frequency of input signal 315 at the input to the receiver is too fast or too slow, phase detector 325 may generate CDR pulses 345 that accumulate all in one direction, such as all or substantially all down pulses or all or substantially all up pulses, respectively, the clock recovery function of CDR 335 may not be able to center on the input signal 315. In various embodiments, a pulse characteristic may include information (for instance, a "pulse directionality") indicating whether CDR pulses 345 are accumulating in one direction or the other (for instance, up or down). In some embodiments, the signal analysis component 355 may count a number of up pulses and a number of down pulses. The signal analysis component 355 may determine a difference between the number of up pulses and the number of down pulses, for instance, for the duration of a pulse analysis duration to determine a pulse directionality. The pulse directionality may be determined by various methods capable of indicating whether there are more up pulses than down pulses. For instance, the number of up pulses may be subtracted from the number of down pulses, or vice versa. In another instance, the number of up pulses may be divided by the number of total pulses to generate an up pulse percentage and the number of down pulses may be divided by the number of total pulses to generate a down pulse percentage. The up pulse percentage and the down pulse percentage may be compared to determine a pulse directionality. In various embodiments, the signal analysis component 355 may determine whether the clock recovery function 335 (for instance, via a phase detector) can center on the input signal based on the pulse directionality. For example, if the pulse directionality is within the directionality threshold, for instance, for the duration of a pulse analysis duration, the signal analysis component 355 may generate an "able to center" determination and/or a valid signal determination. In another example, if the pulse directionality is outside of the directionality threshold, for instance, for the duration of a pulse analysis duration, the signal analysis component 355 may generate an "unable to center" determination and/or an invalid signal determination. In some embodiments, the directionality threshold may include a maximum value associated with a difference between the up pulses and down pulses (for instance, an absolute value, a relative ratio, and/or the like).

In some embodiments, if the signal analysis component 355 determines that the clock recovery function of CDR 335 cannot center on the input signal 315, signal analysis component 355 may generate a signal determination 365 that there is not a valid input signal. In various embodiments, if the signal analysis component 355 determines that the clock recovery function of CDR 335 cannot center on the input signal 315, the signal determination 365 may include an "unable to center" determination 365 based on the pulse directionality characteristic of the CDR pulses 345. For example, signal analysis component 355 may generate an unable to center signal determination if the pulse directionality is outside of a directionality threshold, for instance, when the number, percentage, or other value of one type of pulse (up pulse/down pulse) is outside of the directionality threshold of the other type of pulse (down pulse/up pulse).

In some embodiments, the signal detection module 450 may use a determination 365 that there is not a valid signal, an unable to track determination 365, and/or an unable to center determination 365 alone or qualified by the input amplifier gain to determine if there is a valid signal present. In some embodiments, determination 365 may be provided to one or more signal functions 375 requiring a valid signal and/or information regarding whether there is a valid signal. A non-limiting example of a signal function 375 may include a signal training process. Another non-limiting example of a signal function 375 may include transmission by a transmitter (for example, a transmitter of transceiver 130). For instance, a transmitter may wait to transmit a signal to a link partner until a valid signal at the receiver has been indicated by determination 365.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 4:
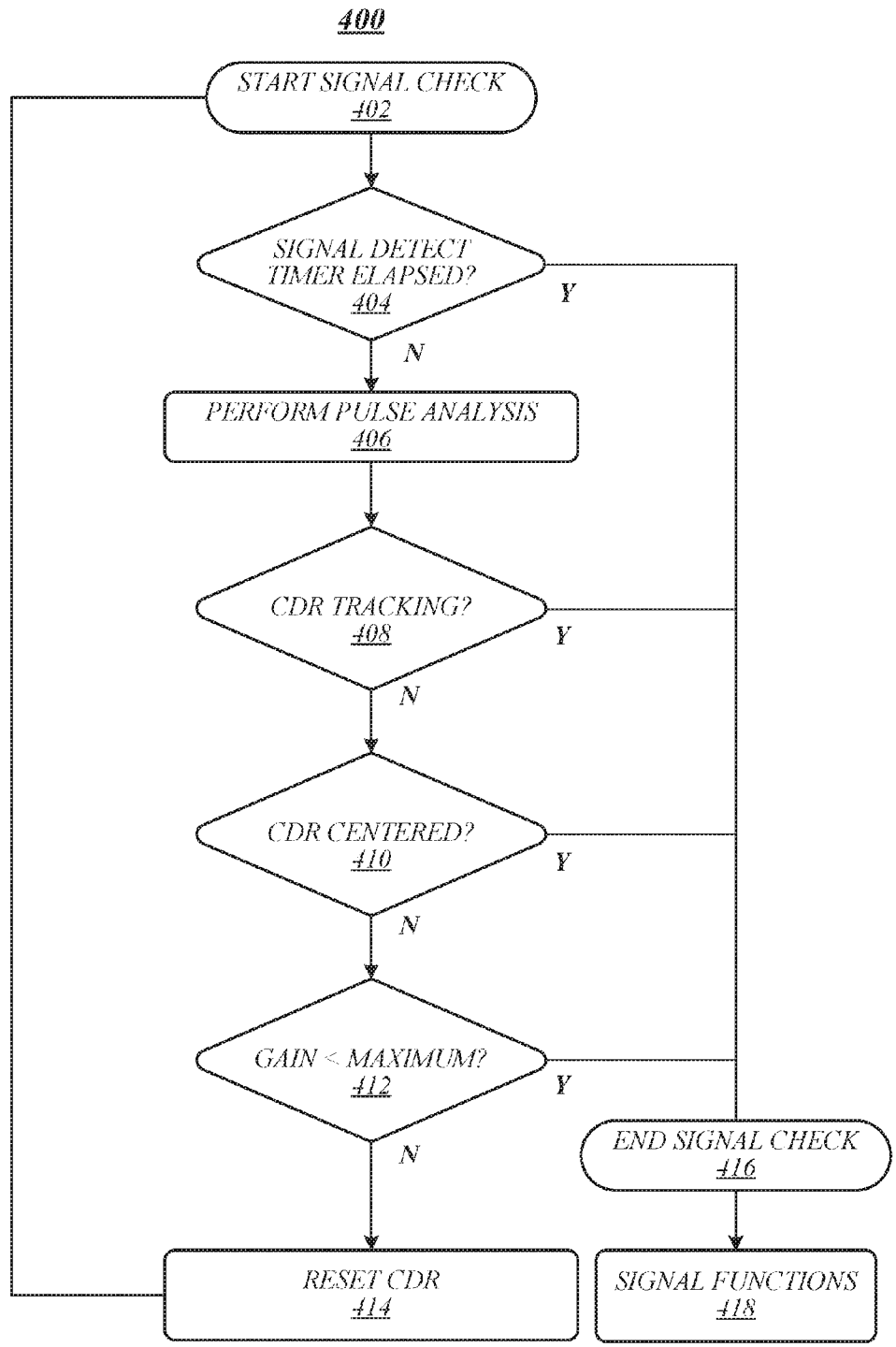
FIG. 4 illustrates an embodiment of a first logic flow.

FIG. 4 illustrates an embodiment of a logic flow 400. The logic flow 400 may be representative of some or all of the operations executed by one or more embodiments described herein, such as apparatus 105 and/or 305, for instance, via one of signal detection modules 150 and/or 350. In some embodiments, logic flow 400 may be representative of some or all of the operations of a signal detection process.

In the illustrated embodiment shown in FIG. 4, logic flow 400 at block 402 may start a signal check, for instance, a signal detection process according to some embodiments. At block 404, logic flow 400 may determine whether a signal detect timer has elapsed. For example, the clock recovery function of CDR 205 may be associated with a signal detect timer. In some embodiments, the signal detect timer may be defined to allow the clock recovery function a specified amount of time to acquire and match the frequency of VCO 260 to the input signal 210. The signal detect timer may operate as a safeguard in the event that additional equalization may be required to assist with clock recovery. If the signal detect timer has elapsed, then the signal check may be ended at block 416.

If the signal detect timer has not elapsed, logic flow 400 may perform pulse analysis at block 406. For example, signal analysis component 355 may operate to analyze CDR pulses 345 generated by phase detector 325. In some embodiments, CDR pulses may be counted or otherwise analyzed, for instance, over a duration (for instance, a sampling window or pulse analysis duration), to obtain a count of both up pulses and down pulses over the duration. At block 408, logic flow 400 may determine whether CDR is tracking a signal. For instance, signal analysis component 355 may analyze a number of accumulated up pulses and down pulses to determine a pulse count value or range. If the up/down pulse value indicates that the up pulses and down pulses that are equal or substantially equal (for instance, within a threshold), logic flow 400 may determine that the CDR is tracking and, therefore, a valid signal is being received by the receiver. For example, if the pulse count is within the count threshold, for instance, for the duration of a pulse analysis duration, the signal analysis component 355 may generate an "able to track" determination and/or a valid signal determination. In another example, if the pulse count is outside of the count threshold, for instance, for the duration of a pulse analysis duration, the signal analysis component 355 may generate an "unable to track" determination and/or an invalid signal determination. Accordingly, logic flow 400 may end the signal check at block 416 and initiate one or more signal functions, such as equalization adaptation. If the up/down pulse value indicates that the up pulses and down pulses are not equal or substantially equal (for instance, outside of a threshold), logic flow 400 may not trigger block 416 to end the signal check.

At block 410, logic flow 400 may determine whether the CDR is centered. For example, a number of pulses may be accumulated over a duration (for instance, a sampling window or pulse analysis duration) may be analyzed to determine whether the count of pulses is within a threshold value or range suitable for the clock recovery function. If the up pulses and/or down pulses are outside of a threshold, insufficient signal edges may be being received by the receiver and, as such, there is not a valid signal. More specifically, if the frequency of input signal 315 at the input to the receiver is too fast or too slow, phase detector 325 may generate CDR pulses 345 that accumulate all in one direction, such as all or substantially all down pulses or all or substantially all up pulses, respectively. A pulse characteristic may include a pulse directionality indicating whether CDR pulses 345 are accumulating in one direction or the other (for instance, up or down). In some embodiments, if the signal analysis component 355 determines that the clock recovery function of CDR 335 cannot center on the input signal 315, 355 based on the pulse directionality, an unable to center signal determination 365 may be generated indicating that there is not a valid input signal. For example, if the pulse directionality is within the directionality threshold, for instance, for the duration of a pulse analysis duration, the signal analysis component 355 may generate an "able to center" determination and/or a valid signal determination. In another example, if the pulse directionality is outside of directionality threshold, for instance, for the duration of a pulse analysis duration, the signal analysis component 355 may generate an "unable to track" determination and/or an invalid signal determination.

If the pulse count indicates that the up pulses and/or down pulses are within the directionality count threshold, logic flow 400 may determine that the CDR is centered and, therefore, a valid signal is being received by the receiver. Accordingly, logic flow 400 may end the signal check at block 416 and initiate one or more signal functions, such as equalization adaptation. If the pulse count indicates that the up pulses and/or down pulses are outside of the pulse count threshold, logic flow 400 may not trigger block 416 to end the signal check.

Logic flow may determine whether the gain of the variable gain amplifier is less than a maximum value at block 412. In some embodiments, the gain of the variable gain amplifier being greater than a maximum value (for instance, saturated or greater than a gain maximum threshold) may indicate a lack of a valid input signal. Checking the gain of the variable gain amplifier against a gain maximum threshold may operate to qualify the clock recover function before resetting the clock recovery circuit at block 414. In some embodiments, if the determinations at blocks 408, 410, and 412 indicate a valid signal, logic flow 400 may reset the CDR at block 414. In some embodiments, there may be a delay or waiting period (for instance, a signal check delay duration) before logic flow 400 proceeds to start signal check at block 402.

Figure 5:
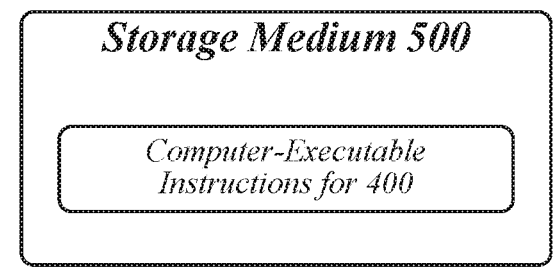
FIG. 5 illustrates an example of a storage medium.

FIG. 5 illustrates an example of a storage medium 500. Storage medium 500 may comprise an article of manufacture. In some examples, storage medium 500 may include any non-transitory computer readable medium or machine readable medium, such as an optical, magnetic or semiconductor storage. Storage medium 500 may store various types of computer executable instructions, such as instructions to implement logic flow 400. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 6:
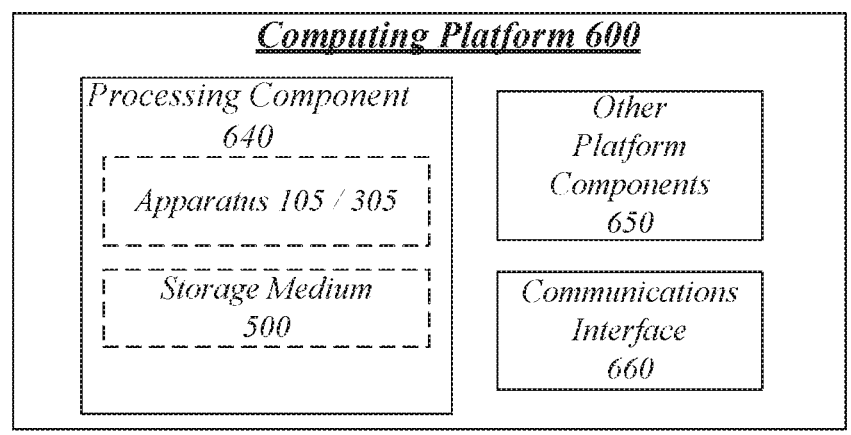
FIG. 6 illustrates an example computing platform.

FIG. 6 illustrates an example computing platform 600. In some examples, as shown in FIG. 6, computing platform 600 may include a processing component 640, other platform components or a communications interface 660. According to some examples, computing platform 600 may be implemented in a computing device such as a server in a system such as a data center. Embodiments are not limited in this context.

According to some examples, processing component 640 may execute processing operations or logic for one of apparatus 105 or 305 and/or storage medium 700. Processing component 640 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 850 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 660 may include logic and/or features to support a communication interface. For these examples, communications interface 660 may include one or more communication interfaces that operate according to various communication protocols or standards to communicate over direct or network communication links. Direct communications may occur via use of communication protocols or standards described in one or more industry standards (including progenies and variants) such as those associated with the PCI Express specification. Network communications may occur via use of communication protocols or standards such those described in one or more Ethernet standards promulgated by the Institute of Electrical and Electronics Engineers (IEEE). For example, one such Ethernet standard may include IEEE 802.3-2015, Carrier sense Multiple access with Collision Detection (CSMA/CD) Access Method and Physical Layer Specifications, Published in December 2012 (hereinafter "IEEE 802.3"). Network communication may also occur according to one or more OpenFlow specifications such as the OpenFlow Hardware Abstraction API Specification. Network communications may also occur according to Infiniband Architecture Specification, Volume 1, Release 1.3, published in March 2015 ("the Infiniband Architecture specification").

Computing platform 600 may be part of a computing device that may be, for example, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 600 described herein, may be included or omitted in various embodiments of computing platform 600, as suitably desired.

The components and features of computing platform 600 may be implemented using any combination of discrete circuitry, ASICs, logic gates and/or single chip architectures. Further, the features of computing platform 600 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing platform 600 shown in the block diagram of FIG. 6 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores"

may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

Example 1 is an apparatus to provide signal detection, the apparatus comprising at least one receiver, at least one memory, and logic for a signal detection module, at least a portion of the logic comprised in hardware coupled to the at least one memory and the at least one receiver, the logic to access a plurality of pulse signals of a clock and data recovery (CDR) circuit, analyze at least one pulse characteristic of the plurality of pulse signals, and generate a signal determination to indicate a signal at the at least one receiver based on the at least one pulse characteristic.

Example 2 is the apparatus of Example 1, the plurality of pulse signals generated by a phase detector of the CDR circuit.

Example 3 is the apparatus of Example 1, the plurality of pulse signals comprising phase error signals generated by a phase detector of the CDR circuit.

Example 4 is the apparatus of Example 1, the plurality of pulse signals comprising at least one of up pulses or down pulses generated by a phase detector of the CDR circuit.

Example 5 is the apparatus of Example 1, the CDR circuit comprising a phase detector and a voltage-controlled oscillator (VCO), the plurality of pulse signals generated by the phase detector to modify a voltage generated by the VCO to correspond with the signal received by the at least one receiver.

Example 6 is the apparatus of Example 1, the logic to determine a number of the plurality of pulse signals over a pulse analysis duration.

Example 7 is the apparatus of Example 1, the logic to determine a directionality of the plurality of pulse signals over a pulse analysis duration.

Example 8 is the apparatus of Example 1, the plurality of pulse signals comprising up pulses and down pulses, the logic to determine a number of up pulses and a number of down pulses over a pulse analysis duration.

Example 9 is the apparatus of Example 1, the at least one pulse characteristic comprising at least one of a pulse count or a pulse directionality.

Example 10 is the apparatus of Example 1, the at least one pulse characteristic comprising a pulse count.

Example 11 is the apparatus of Example 1, the at least one pulse characteristic comprising a pulse count to indicate whether a phase detector of the CDR circuit detects edges of a signal received by the at least one receiver.

Example 12 is the apparatus of Example 1, the at least one pulse characteristic comprising a pulse count, the pulse count comprising a number of up pulses or down pulses generated by a phase detector of the CDR circuit over a pulse analysis duration.

Example 13 is the apparatus of Example 1, the at least one pulse characteristic comprising a pulse count, the logic to generate an unable to track determination responsive to the pulse count being outside of a pulse count threshold.

Example 14 is the apparatus of Example 1, the at least one pulse characteristic comprising a pulse count, the logic to generate an invalid signal determination responsive to the pulse count being outside of a pulse count threshold.

Example 15 is the apparatus of Example 1, the at least one pulse characteristic comprising a pulse count, the logic to generate an able to track determination responsive to the pulse count being within a pulse count threshold.

Example 16 is the apparatus of Example 1, the at least one pulse characteristic comprising a pulse count, the logic to generate a valid signal determination responsive to the pulse count being within a pulse count threshold.

Example 17 is the apparatus of Example 1, the at least one pulse characteristic comprising a pulse directionality.

Example 18 is the apparatus of Example 1, the at least one pulse characteristic comprising a pulse directionality to indicate whether phase error signals generated by a phase detector of the CDR circuit are accumulating in an up direction or a down direction.

Example 19 is the apparatus of Example 1, the at least one pulse characteristic comprising a pulse directionality, the pulse directionality comprising a directionality of up pulses or down pulses generated by a phase detector of the CDR circuit over a pulse analysis duration.

Example 20 is the apparatus of Example 1, the at least one pulse characteristic comprising a pulse directionality, the logic to generate an unable to center determination responsive to the pulse directionality being outside of a directionality threshold.

Example 21 is the apparatus of Example 1, the at least one pulse characteristic comprising a pulse directionality, the logic to generate an invalid signal determination responsive to the pulse directionality being outside of a directionality threshold.

Example 22 is the apparatus of Example 1, the at least one pulse characteristic comprising a pulse directionality, the logic to generate an able to center determination responsive to the pulse directionality being within a directionality threshold.

Example 23 is the apparatus of Example 1, the at least one pulse characteristic comprising a pulse directionality, the logic to generate a valid signal determination responsive to the pulse directionality being outside of a directionality threshold.

Example 24 is the apparatus of Example 1, the logic to determine a gain of a variable gain amplifier of the CDR.

Example 25 is the apparatus of Example 1, the logic to generate an invalid signal determination responsive to determining that a gain of a variable gain amplifier of the CDR is greater than a maximum gain threshold Example 26 is the apparatus of Example 1, the logic to generate an invalid signal determination responsive to at least one of expiry of a signal detect timer, an unable to track determination, or an unable to center determination.

Example 27 is the apparatus of Example 1, the logic to generate a valid signal determination responsive to at least one of an able to track determination or an able to center determination.

Example 28 is the apparatus of Example 1, the logic to generate a valid signal determination responsive to a phase detector of the CDR indicating a valid signal at the at least one receiver.

Example 29 is the apparatus of Example 1, the logic to initiate a signal detect timer for a clock recovery function of the CDR to complete.

Example 30 is the apparatus of Example 1, the logic to generate an invalid signal determination responsive to expiry of a signal detect timer.

Example 31 is the apparatus of Example 1, the logic to provide the signal determination to at least one signal function.

Example 32 is the apparatus of Example 1, the logic to provide the signal determination to at least one signal function, the at least one function comprising equalization adaptation.

Example 33 is a system to provide signal detection, comprising an apparatus according to any of Examples 1 to 32, and at least one radio frequency (RF) transceiver.

Example 34 is a method to provide signal detection, the method comprising accessing a plurality of pulse signals of a clock and data recovery (CDR) circuit, analyzing at least one pulse characteristic of the plurality of pulse signals for, and generating a signal determination to indicate a signal at a receiver communicatively coupled to the CDR, the signal determination based on the at least one pulse characteristic.

Example 35 is the method of Example 11, the plurality of pulse signals generated by a phase detector of the CDR circuit.

Example 36 is the method of Example 11, the plurality of pulse signals comprising phase error signals generated by a phase detector of the CDR circuit.

Example 37 is the method of Example 11, the plurality of pulse signals comprising at least one of up pulses or down pulses generated by a phase detector of the CDR circuit.

Example 38 is the method of Example 11, the CDR circuit comprising a phase detector and a voltage-controlled oscillator (VCO), the plurality of pulse signals generated by the phase detector to modify a voltage generated by the VCO to correspond with the signal received by the at least one receiver.

Example 39 is the method of Example 11, comprising determining a number of the plurality of pulse signals over a pulse analysis duration.

Example 40 is the method of Example 11, comprising determining a directionality of the plurality of pulse signals over a pulse analysis duration.

Example 41 is the method of Example 11, comprising determining a number of the plurality of pulse signals over a pulse analysis duration, the plurality of pulse signals comprising up pulses and down pulses.

Example 42 is the method of Example 11, the at least one pulse characteristic comprising at least one of a pulse count or a pulse directionality.

Example 43 is the method of Example 11, the at least one pulse characteristic comprising a pulse count.

Example 44 is the method of Example 11, the at least one pulse characteristic comprising a pulse count to indicate whether a phase detector of the CDR circuit detects edges of a signal received by the at least one receiver.

Example 45 is the method of Example 11, the at least one pulse characteristic comprising a pulse count, the pulse count comprising a number of up pulses or down pulses generated by a phase detector of the CDR circuit over a pulse analysis duration.

Example 46 is the method of Example 11, comprising generating an unable to track determination responsive to a pulse count being outside of a pulse count threshold.

Example 47 is the method of Example 11, comprising generating an invalid signal determination responsive to a pulse count being outside of a pulse count threshold.

Example 48 is the method of Example 11, comprising generating an able to track determination responsive to a pulse count being within a pulse count threshold.

Example 49 is the method of Example 11, comprising generating a valid signal determination responsive to a pulse count being within a pulse count threshold.

Example 50 is the method of Example 11, the at least one pulse characteristic comprising a pulse directionality.

Example 51 is the method of Example 11, the at least one pulse characteristic comprising a pulse directionality to indicate whether phase error signals generated by a phase detector of the CDR circuit are accumulating in an up direction or a down direction.

Example 52 is the method of Example 11, the at least one pulse characteristic comprising a pulse directionality, the pulse directionality comprising a directionality of up pulses or down pulses generated by a phase detector of the CDR circuit over a pulse analysis duration.

Example 53 is the method of Example 11, comprising generating an unable to center determination responsive to a pulse directionality being outside of a directionality threshold.

Example 54 is the method of Example 11, comprising generating an invalid signal determination responsive to a pulse directionality being outside of a directionality threshold.

Example 55 is the method of Example 11, comprising generating an able to center determination responsive to a pulse directionality being within a directionality threshold.

Example 56 is the method of Example 11, comprising generating a valid signal determination responsive to a pulse directionality being outside of a directionality threshold.

Example 57 is the method of Example 11, comprising determining a gain of a variable gain amplifier of the CDR.

Example 58 is the method of Example 11, comprising generating an invalid signal determination responsive to determining that a gain of a variable gain amplifier of the CDR is greater than a maximum gain threshold.

Example 59 is the method of Example 11, comprising generating an invalid signal determination responsive to at least one of expiry of a signal detect timer, an unable to track determination, or an unable to center determination.

Example 60 is the method of Example 11, comprising generating a valid signal determination responsive to at least one of an able to track determination or an able to center determination.

Example 61 is the method of Example 11, comprising generating a valid signal determination responsive to a phase detector of the CDR indicating a valid signal at the at least one receiver.

Example 62 is the method of Example 11, comprising initiating a signal detect timer for a clock recovery function of the CDR to complete.

Example 63 is the method of Example 11, comprising generating an invalid signal determination responsive to expiry of a signal detect timer.

Example 64 is the method of Example 11, comprising providing the signal determination to at least one signal function.

Example 65 is the method of Example 11, comprising providing the signal determination to at least one signal function, the at least one function comprising equalization adaptation.

Example 66 is a system to provide queue congestion management, comprising an apparatus operative to perform a method according to any of Examples 34 to 65, and at least one radio frequency (RF) transceiver.

Example 67 is a computer-readable storage medium that stores instructions for execution by processing circuitry of a computing device for signal detection, the instructions to cause the computing device to access a plurality of pulse signals of a clock and data recovery (CDR) circuit, analyze at least one pulse characteristic of the plurality of pulse signals, and generate a signal determination to indicate a signal at a receiver communicatively coupled to the CDR, the signal determination based on the at least one pulse characteristic.

Example 67 is the computer-readable storage medium of Example 67, the plurality of pulse signals generated by a phase detector of the CDR circuit.

Example 69 is the computer-readable storage medium of Example 67, the plurality of pulse signals comprising phase error signals generated by a phase detector of the CDR circuit.

Example 70 is the computer-readable storage medium of Example 67, the plurality of pulse signals comprising at least one of up pulses or down pulses generated by a phase detector of the CDR circuit.

Example 71 is the computer-readable storage medium of Example 67, the CDR circuit comprising a phase detector and a voltage-controlled oscillator (VCO), the plurality of pulse signals generated by the phase detector to modify a voltage generated by the VCO to correspond with the signal received by the at least one receiver.

Example 72 is the computer-readable storage medium of Example 67, the instructions to cause the computing device to determine a number of the plurality of pulse signals over a pulse analysis duration.

Example 73 is the computer-readable storage medium of Example 67, the instructions to cause the computing device to determine a directionality of the plurality of pulse signals over a pulse analysis duration.

Example 74 is the computer-readable storage medium of Example 67, the instructions to cause the computing device to determine a number of the plurality of pulse signals over a pulse analysis duration, the plurality of pulse signals comprising up pulses and down pulses.

Example 75 is the computer-readable storage medium of Example 67, the at least one pulse characteristic comprising at least one of a pulse count or a pulse directionality Example 76 is the computer-readable storage medium of Example 67, the at least one pulse characteristic comprising a pulse count.

Example 77 is the computer-readable storage medium of Example 67, the at least one pulse characteristic comprising a pulse count to indicate whether a phase detector of the CDR circuit detects edges of a signal received by the at least one receiver.

Example 78 is the computer-readable storage medium of Example 67, the at least one pulse characteristic comprising a pulse count, the pulse count comprising a number of up pulses or down pulses generated by a phase detector of the CDR circuit over a pulse analysis duration.

Example 79 is the computer-readable storage medium of Example 67, the instructions to cause the computing device to generate an unable to track determination responsive to a pulse count being outside of a pulse count threshold.

Example 80 is the computer-readable storage medium of Example 67, the instructions to cause the computing device to generate an invalid signal determination responsive to a pulse count being outside of a pulse count threshold.

Example 81 is the computer-readable storage medium of Example 67, the instructions to cause the computing device to generate an able to track determination responsive to a pulse count being within a pulse count threshold.

Example 82 is the computer-readable storage medium of Example 67, the instructions to cause the computing device to generate a valid signal determination responsive to a pulse count being within a pulse count threshold.

Example 83 is the computer-readable storage medium of Example 67, the at least one pulse characteristic comprising a pulse directionality.

Example 84 is the computer-readable storage medium of Example 67, the at least one pulse characteristic comprising a pulse directionality to indicate whether phase error signals generated by a phase detector of the CDR circuit are accumulating in an up direction or a down direction.

Example 85 is the computer-readable storage medium of Example 67, the at least one pulse characteristic comprising a pulse directionality, the pulse directionality comprising a directionality of up pulses or down pulses generated by a phase detector of the CDR circuit over a pulse analysis duration.

Example 86 is the computer-readable storage medium of Example 67, the instructions to cause the computing device to generate an unable to center determination responsive to a pulse directionality being outside of a directionality threshold.

Example 87 is the computer-readable storage medium of Example 67, the instructions to cause the computing device to generate an invalid signal determination responsive to a pulse directionality being outside of a directionality threshold.

Example 88 is the computer-readable storage medium of Example 67, the instructions to cause the computing device to generate an able to center determination responsive to a pulse directionality being within a directionality threshold.

Example 89 is the computer-readable storage medium of Example 67, the instructions to cause the computing device to generate a valid signal determination responsive to a pulse directionality being outside of a directionality threshold.

Example 90 is the computer-readable storage medium of Example 67, the instructions to cause the computing device to determine a gain of a variable gain amplifier of the CDR.

Example 91 is the computer-readable storage medium of Example 67, the instructions to cause the computing device to generate an invalid signal determination responsive to determining that a gain of a variable gain amplifier of the CDR is greater than a maximum gain threshold.

Example 92 is the computer-readable storage medium of Example 67, the instructions to cause the computing device to generate an invalid signal determination responsive to at least one of expiry of a signal detect timer, an unable to track determination, or an unable to center determination.

Example 93 is the computer-readable storage medium of Example 67, the instructions to cause the computing device to generate a valid signal determination responsive to at least one of an able to track determination or an able to center determination.

Example 94 is the computer-readable storage medium of Example 67, the instructions to cause the computing device to generate a valid signal determination responsive to a phase detector of the CDR indicating a valid signal at the at least one receiver.

Example 95 is the computer-readable storage medium of Example 67, the instructions to cause the computing device to initiate a signal detect timer for a clock recovery function of the CDR to complete.

Example 96 is the computer-readable storage medium of Example 67, the instructions to cause the computing device to generate an invalid signal determination responsive to expiry of a signal detect timer.

Example 97 is the computer-readable storage medium of Example 67, the instructions to cause the computing device to provide the signal determination to at least one signal function.

Example 98 is the computer-readable storage medium of Example 67, the instructions to cause the computing device to provide the signal determination to at least one signal function, the at least one function comprising equalization adaptation.

Example 99 is an apparatus to provide signal detection, the apparatus comprising at least one receiver means, a pulse signal access means to access a plurality of pulse signals of a clock and data recovery (CDR) circuit, an analysis means to analyze at least one pulse characteristic of the plurality of pulse signals, and a determination means to generate a signal determination to indicate a signal at the at least one receiver based on the at least one pulse characteristic.

Example 100 is the apparatus of Example 99, the plurality of pulse signals generated by a phase detector of the CDR circuit.

Example 101 is the apparatus of Example 99, the plurality of pulse signals comprising phase error signals generated by a phase detector of the CDR circuit.

Example 102 is the apparatus of Example 99, the plurality of pulse signals comprising at least one of up pulses or down pulses generated by a phase detector of the CDR circuit.

Example 103 is the apparatus of Example 99, the CDR circuit comprising a phase detector and a voltage-controlled oscillator (VCO), the plurality of pulse signals generated by the phase detector to modify a voltage generated by the VCO to correspond with the signal received by the at least one receiver.

Example 104 is the apparatus of Example 99, the determination means to determine a number of the plurality of pulse signals over a pulse analysis duration.

Example 105 is the apparatus of Example 99, the determination means to determine a directionality of the plurality of pulse signals over a pulse analysis duration.

Example 106 is the apparatus of Example 99, the determination means to determine a number of the plurality of pulse signals over a pulse analysis duration, the plurality of pulse signals comprising up pulses and down pulses.

Example 107 is the apparatus of Example 99, the at least one pulse characteristic comprising at least one of a pulse count or a pulse directionality.

Example 108 is the apparatus of Example 99, the at least one pulse characteristic comprising a pulse count.

Example 109 is the apparatus of Example 99, the at least one pulse characteristic comprising a pulse count to indicate whether a phase detector of the CDR circuit detects edges of a signal received by the at least one receiver.

Example 110 is the apparatus of Example 99, the at least one pulse characteristic comprising a pulse count, the pulse count comprising a number of up pulses or down pulses generated by a phase detector of the CDR circuit over a pulse analysis duration.

Example 111 is the apparatus of Example 99, the determination means to generate an unable to track determination responsive to a pulse count being outside of a pulse count threshold.

Example 112 is the apparatus of Example 99, the determination means to generate an invalid signal determination responsive to a pulse count being outside of a pulse count threshold.

Example 113 is the apparatus of Example 99, the determination means to generate an able to track determination responsive to a pulse count being within a pulse count threshold.

Example 114 is the apparatus of Example 99, the determination means to generate a valid signal determination responsive to a pulse count being within a pulse count threshold.

Example 115 is the apparatus of Example 99, the at least one pulse characteristic comprising a pulse directionality.

Example 116 is the apparatus of Example 99, the at least one pulse characteristic comprising a pulse directionality to indicate whether phase error signals generated by a phase detector of the CDR circuit are accumulating in an up direction or a down direction.

Example 117 is the apparatus of Example 99, the at least one pulse characteristic comprising a pulse directionality, the pulse directionality comprising a directionality of up pulses or down pulses generated by a phase detector of the CDR circuit over a pulse analysis duration.

Example 118 is the apparatus of Example 99, the determination means to generate an unable to center determination responsive to a pulse directionality being outside of a directionality threshold.

Example 119 is the apparatus of Example 99, the determination means to generate an invalid signal determination responsive to a pulse directionality being outside of a directionality threshold.

Example 120 is the apparatus of Example 99, the determination means to generate an able to center determination responsive to a pulse directionality being within a directionality threshold.

Example 121 is the apparatus of Example 99, the determination means to generate a valid signal determination responsive to a pulse directionality being outside of a directionality threshold.

Example 122 is the apparatus of Example 99, the determination means to determine a gain of a variable gain amplifier of the CDR.

Example 123 is the apparatus of Example 99, the determination means to generate an invalid signal determination responsive to determining that a gain of a variable gain amplifier of the CDR is greater than a maximum gain threshold.

Example 124 is the apparatus of Example 99, the determination means to generate an invalid signal determination responsive to at least one of expiry of a signal detect timer, an unable to track determination, or an unable to center determination.

Example 125 is the apparatus of Example 99, the determination means to generate a valid signal determination responsive to at least one of an able to track determination or an able to center determination.

Example 126 is the apparatus of Example 99, the determination means to generate a valid signal determination responsive to a phase detector of the CDR indicating a valid signal at the at least one receiver.

Example 127 is the apparatus of Example 99, comprising a timing means to initiate a signal detect timer for a clock recovery function of the CDR to complete.

Example 128 is the apparatus of Example 99, the determination means to generate an invalid signal determination responsive to expiry of a signal detect timer.

Example 129 is the apparatus of Example 99, comprising a communication means to provide the signal determination to at least one signal function.

Example 130 is the apparatus of Example 99, comprising a communication means to provide the signal determination to at least one signal function, the at least one function comprising equalization adaptation.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus to provide signal detection, the apparatus comprising:
   at least one receiver;
   at least one memory; and
   logic, at least a portion of the logic comprised in hardware coupled to the at least one memory and the at least one receiver, the logic to:
      access a plurality of pulse signals of a clock and data recovery (CDR) circuit,
      analyze at least one pulse characteristic of the plurality of pulse signals,
      generate a signal determination to indicate a signal at the at least one receiver based on the at least one pulse characteristic; and
      generate an invalid signal determination responsive to expiry of a signal detect timer.

2. The apparatus of claim 1, the plurality of pulse signals generated by a phase detector of the CDR circuit.

3. The apparatus of claim 1, the plurality of pulse signals comprising phase error signals generated by a phase detector of the CDR circuit.

4. The apparatus of claim 1, the at least one pulse characteristic comprising a pulse count.

5. The apparatus of claim 1, the at least one pulse characteristic comprising a pulse count,
   the logic to generate an unable to track determination responsive to the pulse count being outside of a pulse count threshold.

6. The apparatus of claim 1, the at least one pulse characteristic comprising a pulse directionality.

7. The apparatus of claim 1, the at least one pulse characteristic comprising a pulse directionality,
   the logic to generate an unable to center determination responsive to the pulse directionality being outside of a directionality threshold.

8. The apparatus of claim 1, the logic to generate an invalid signal determination responsive to determining that a gain of a variable gain amplifier of the CDR is greater than a maximum gain threshold.

9. The apparatus of claim 1, the logic to provide the signal determination to at least one signal function.

10. A method to provide signal detection, the method comprising:
    accessing a plurality of pulse signals of a clock and data recovery (CDR) circuit;
    analyzing at least one pulse characteristic of the plurality of pulse signals for;
    generating a signal determination to indicate a signal at a receiver communicatively coupled to the CDR, the signal determination based on the at least one pulse characteristic; and
    generating an invalid signal determination responsive to expiry of a signal detect timer.

11. The method of claim 10, the plurality of pulse signals generated by a phase detector of the CDR circuit.

12. The method of claim 10, the plurality of pulse signals comprising phase error signals generated by a phase detector of the CDR circuit.

13. The method of claim 10, the at least one pulse characteristic comprising a pulse count.

14. The method of claim 10, comprising generating an unable to track determination responsive to a pulse count being outside of a pulse count threshold.

15. The method of claim 10, the at least one pulse characteristic comprising a pulse directionality.

16. The method of claim 10, comprising generating an unable to center determination responsive to a pulse directionality being outside of a directionality threshold.

17. The method of claim 10, comprising generating an invalid signal determination responsive to determining that a gain of a variable gain amplifier of the CDR is greater than a maximum gain threshold.

18. The method of claim 10, comprising providing the signal determination to at least one signal function.

19. A non-transitory computer-readable storage medium that stores instructions for execution by processing circuitry of a computing device for signal detection, the instructions to cause the computing device to:

access a plurality of pulse signals of a clock and data recovery (CDR) circuit;

analyze at least one pulse characteristic of the plurality of pulse signals;

generating a signal determination to indicate a signal at a receiver communicatively coupled to the CDR, the signal determination based on the at least one pulse characteristic; and generate an invalid signal determination responsive to expiry of a signal detect timer.

20. The non-transitory computer-readable storage medium of claim 19, the plurality of pulse signals comprising phase error signals generated by a phase detector of the CDR circuit.

21. The non-transitory computer-readable storage medium of claim 19, the at least one pulse characteristic comprising a pulse count.

22. The non-transitory computer-readable storage medium of claim 19, the at least one pulse characteristic comprising a pulse directionality.

23. The non-transitory computer-readable storage medium of claim 19, the instructions to cause the computing device to provide the signal determination to at least one signal function.

* * * * *